United States Patent
Qiang

(10) Patent No.: US 10,020,806 B2
(45) Date of Patent: Jul. 10, 2018

(54) REED SWITCH WITH COMMUNICATION FUNCTION WHICH USED FOR URINAL

(71) Applicant: Shanghai Kohler Electronics, Ltd., Shanghai (CN)

(72) Inventor: Xiao Qiang, Shanghai (CN)

(73) Assignee: SHANGHAI KOHLER ELECTRONICS, LTD. (CN)

( * ) Notice: Subject to any disclaimer, the term of this patent is extended or adjusted under 35 U.S.C. 154(b) by 0 days.

(21) Appl. No.: 15/345,141

(22) Filed: Nov. 7, 2016

(65) Prior Publication Data

US 2017/0134023 A1    May 11, 2017

(30) Foreign Application Priority Data

Nov. 11, 2015  (CN) .......................... 2015 1 0767058

(51) Int. Cl.
| | |
|---|---|
| *E03D 13/00* | (2006.01) |
| *H03K 17/95* | (2006.01) |
| *E03C 1/05* | (2006.01) |
| *E03D 5/10* | (2006.01) |
| *H03K 17/90* | (2006.01) |
| *H01H 51/00* | (2006.01) |

(52) U.S. Cl.
CPC ......... *H03K 17/9512* (2013.01); *E03C 1/057* (2013.01); *E03D 5/105* (2013.01); *H01H 51/00* (2013.01); *H03K 17/90* (2013.01)

(58) Field of Classification Search
CPC .... H03K 17/9512; H03K 17/90; E03C 1/057; E03D 5/105; H01H 51/00; G01R 35/00; G01R 15/148; G01R 15/20; G01F 11/06

USPC .................................. 4/305; 324/200, 207.2
See application file for complete search history.

(56) References Cited

U.S. PATENT DOCUMENTS

| | | | | | |
|---|---|---|---|---|---|
| 3,660,696 | A | * | 5/1972 | Rittmann | H03K 17/90 307/116 |
| 3,829,719 | A | * | 8/1974 | Schweikart | H03K 17/90 307/116 |
| 3,944,912 | A | * | 3/1976 | Angel | G01R 33/04 324/233 |
| 4,295,118 | A | * | 10/1981 | Herr | H03K 17/9517 323/294 |
| 5,696,445 | A | * | 12/1997 | Inbar | G01R 33/1253 324/210 |

(Continued)

FOREIGN PATENT DOCUMENTS

| | | |
|---|---|---|
| CN | 102107697 A | 6/2011 |
| CN | 102353161 A | 2/2012 |
| CN | 203057101 U | 7/2013 |

OTHER PUBLICATIONS

Chinese Office Action issued in corresponding application No. 201510767058 dated Mar. 13, 2017.

*Primary Examiner* — Benjamin R Shaw
(74) *Attorney, Agent, or Firm* — Foley & Lardner LLP

(57) ABSTRACT

A system for controlling a magnetic switch in urinals includes a switch control unit and a control signal receiving unit connected to the switch control unit via a magnetic field. The switch control unit is configured to generate and eliminate the magnetic field based on a received pulse signal. The control signal receiving unit outputs an on signal in response to sensing the generation of the magnetic field and outputs an off signal in response to sensing the elimination of the magnetic field.

20 Claims, 2 Drawing Sheets

(56) References Cited

U.S. PATENT DOCUMENTS 9,733,631 B2 * 8/2017 Fangsheng ............. G05B 15/02
2010/0125937 A1 * 5/2010 Chen ....................... E03D 5/105
4/305

* cited by examiner

REED SWITCH WITH COMMUNICATION FUNCTION WHICH USED FOR URINAL

CROSS-REFERENCE TO RELATED PATENT APPLICATIONS

The present application claims the benefit of and priority to Chinese Patent Application No. 201510767058.3, filed Nov. 11, 2015, which is incorporated herein by reference in its entirety, including the specification, the drawings, the claims, and the abstract.

BACKGROUND

The present application relates to the field of switches for use with urinals, toilets and other bathroom devices. More specifically, this application relates to systems and methods for controlling a magnetic switch for use with urinals, toilets and other bathroom devices.

SUMMARY

In one or more embodiments, a system for controlling a magnetic switch is provided. The system uses a current coil to generate a magnetic field to turn on the magnetic switch, such that there is no need to use a magnetic rod to approach a reed switch to turn on the reed switch, and consequently the operation to turn on the reed switch is more convenient. The present application further provides a method for controlling a magnetic switch.

In one or more embodiments, a system for controlling a magnetic switch includes a switch control unit and a control signal receiving unit connected to said switch control unit via a magnetic field. The switch control unit is configured to generate a magnetic field or to eliminate a magnetic field based on a received pulse signal. The control signal receiving unit is configured to output an on signal if sensing the generation of a magnetic field, or to output an off signal if sensing the elimination of a magnetic field.

In one or more embodiments, the switch control unit includes a first power source and a coil, where a first end of the coil is connected to the first power source, and a second end of the coil is grounded.

In one or more embodiments, the control signal receiving unit includes a magnetic switch for outputting an on signal in response to sensing the generation of a magnetic field and for outputting an off signal in response to sensing the elimination of a magnetic field.

In one or more embodiments, the system/method includes a sensing device electrically connected to a magnetic switch, where a first power source outputs a high level or a low level to generate a pulse signal. The sensing device generates coded data according to the on signal or the off signal outputted by the magnetic switch, and the sensing device adjusts sensing parameters of the sensing device according to the coded data.

In one or more embodiments, the switch control unit includes a controller and a triode. The controller is electrically connected to a base of the triode, a collector of the triode is electrically connected to a second end of the coil, and an emitter of the triode is grounded.

In one or more embodiments, the system/method includes a sensing device electrically connected to a magnetic switch, as well as a controller for transmitting a pulse signal generated by a high level and a low level. The sensing device receives the pulse signal via a magnetic field and generates coded data according to the pulse signal, and the sensing device adjusts sensing parameters of the sensing device according to the coded data.

In one or more embodiments, the system/method includes a sensing device electrically connected to a magnetic switch, as well as a controller for transmitting a pulse signal generated by a high level and a low level. The sensing device generates coded data according to the on signal or the off signal outputted by the magnetic switch, and the sensing device combines a plurality of the coded data into command data and adjusts sensing parameters of the sensing device according to the command data.

In one or more embodiments, different coded data correspond to different pulse waves.

In one or more embodiments, the sensing device includes at least one of a urinal motion sensor, a faucet motion sensor, and a toilet sensor.

In one or more embodiments, the magnetic switch is a reed switch.

In one or more embodiments, a method for controlling a magnetic switch is provided and includes generating a magnetic field or eliminating a magnetic field based on a received pulse signal; and outputting an on signal if sensing the generation of a magnetic field, or outputting an off signal if sensing the elimination of a magnetic field.

In one or more embodiments, a urinal or toilet includes a switch control unit and a control signal receiving unit. The switch control unit is configured to generate and eliminate a magnetic field in response to a pulse signal, and the switch unit includes a power source and a coil having a first end electrically coupled to the power source to generate the magnetic field in an on position, in which the coil receives an electric current from the power source. The control signal receiving unit includes a motion sensor having an input terminal and a normally open reed switch that closes in response to the magnetic field to output an on signal to the input terminal.

The switch control unit may include a controller for outputting the control signal and a triode having a base, a collector, and an emitter, wherein the base is electrically coupled to the controller, the collector is electrically coupled to a second end of the coil, and the emitter is grounded.

The control signal receiving unit may include a power source and a resistor having a first end, which is electrically coupled to the reed switch, and a second end, which is electrically coupled to the power source.

The normally open reed switch may be configured to be open in an absence of the magnetic field and an off signal is output to the input terminal. The motion sensor may generate coded data in response to the on signals and the off signals, combine a plurality of the coded data into command data, and compare the command data with a command threshold value predefined to increase a sensing distance of the motion sensor by a distance.

The above systems/methods provide several advantageous effects. For example, a switch control unit is used to generate a magnetic field or to eliminate a magnetic field based on a received pulse signal, such that a control signal receiving unit outputs an on signal if sensing the generation of a magnetic field, or outputs an off signal if sensing the elimination of a magnetic field, thereby achieving the control on the type of magnetic switches like reed switch. Also, for example, a magnetic switch is turned on by using a current coil to generate a magnetic field, which makes it unnecessary to manually hold a magnetic rod to approach a magnetic switch such that it is turned on, leading to a more convenient operation mode. Moreover, the current coil is placed within the on distance of the magnetic switch, which significantly improves the on rate of the magnetic switch. The systems/methods of the present application may further employ a controller to transmit a high level or a low level, through which it controls the magnetic field of the current coil so as to turn on or turn off the reed switch. The control of a reed switch in such a manner is more accurate. The systems/methods of the present application may further employ a controller to transmit a pulse signal to control the magnetic field of the current coil, such that the reed switch generates coded data. The control in such a manner is more accurate for a sensor equipped with a reed switch, and enables the reed switch to encode and communicate.

DETAILED DESCRIPTION

A reed switch is a magnetic switch element configured such that when a magnet is moved toward the reed switch, the reed switch senses a magnetic field and will turn on (e.g., if the switch is normally closed) or turn off (e.g., if the switch is normally open). If the magnet is moved away from the reed switch, a normally closed reed switch will turn off and a normally open reed switch will turn on. Since regular small-sized sensor products typically need to be encapsulated with glue, they may not be suitable for leading out wires, and therefore, conventional switches may not be applicable for them. Reed switches can be used in small-sized sensor products as switches, and a magnetic rod may be used to trigger the reed switch, which solves the problem of installing a switch for a small-sized sensor product that may not be suitable for leading out wires. At the same time, there may no longer be a need to install a button panel for the sensor product. The use of a magnetic rod to trigger a reed switch may require a person to hold the magnetic rod to approach the reed switch such that the reed switch is turned on, which is not convenient than a conventional switch in use. Moreover, manual operations are not accurate in terms of the on distance of a reed switch, which leads to a low on rate of reed switches.

The systems/methods disclosed in this application address the potential problems discussed above. Such as a system is configured to control a magnetic switch and includes a switch control unit and a control signal receiving unit connected to said switch control unit via a magnetic field. The switch control unit is configured to generate a magnetic field or to eliminate a magnetic field based on a received pulse signal; the control signal receiving unit is configured to output an on signal if sensing the generation of a magnetic field, or to output an off signal if sensing the elimination of a magnetic field. Such a method includes generating a magnetic field or eliminating a magnetic field based on a received pulse signal; outputting an on signal if sensing the generation of a magnetic field, or outputting an off signal if sensing the elimination of a magnetic field. A current coil may be used to generate a magnetic field, such that the magnetic switch is turned on and the operation to turn on a reed switch is more convenient. Such systems/methods also achieve more accurate control of a sensor equipped with a reed switch by transmitting a pulse signal through a controller to cause the reed switch to generate coded data.

One or more embodiments of this application will now be described in detail below with reference to the accompanying drawings.

Figure 1:
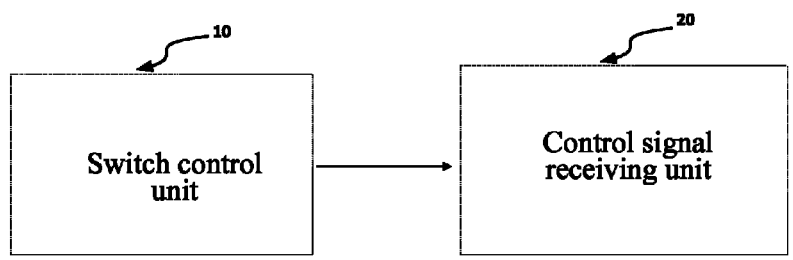
FIG. 1 illustrates an exemplary embodiment of a structural of a system for controlling a magnetic switch.

FIG. 1 illustrates a system for controlling a magnetic switch that includes a switch control unit 10 and a control signal receiving unit 20, which is connected to the switch control unit 10 via a magnetic field. The switch control unit 10 is configured to generate a magnetic field or to eliminate a magnetic field based on (e.g., in response to) a received pulse signal. The control signal receiving unit 20 is configured to output an on signal if (e.g., in response to) sensing the generation of a magnetic field, or to output an off signal if sensing the elimination of a magnetic field.

The switch control unit 10 includes a circuit and a coil (see, for example, FIG. 4), which is powered on by the circuit to generate a magnetic field. The control signal receiving unit 20 includes a magnetic switch, which is turned on when sensing a magnetic field, and the control signal receiving unit 20 outputs an on signal. When the coil is powered off to eliminate the magnetic field, the magnetic switch is turned off in response to sensing that the magnetic field is eliminated, and the control signal receiving unit 20 outputs an off signal.

The switch control unit 20 is used to generate a magnetic field or to eliminate a magnetic field based on a received pulse signal, such that the control signal receiving unit 20 outputs an on signal in response to sensing the generation of a magnetic field, or outputs an off signal in response to sensing the elimination of a magnetic field. This achieves the control on the type of magnetic switches like reed switch. The magnetic switch is turned on by using a current coil to generate a magnetic field, which makes it unnecessary to manually hold a magnetic rod to approach a magnetic switch such that it is turned on, leading to a more convenient operation mode. Moreover, the current coil is placed within the on distance of the magnetic switch, which significantly improves the on rate of the magnetic switch.

In one or more embodiments, the switch control unit 10 includes a first power source and a coil. A first end of the coil is connected to the first power source, and a second end of the coil is grounded. The control signal receiving unit 20 includes a magnetic switch for outputting an on signal in response to sensing the generation of a magnetic field and for outputting an off signal in response to sensing the elimination of a magnetic field. For example, when the first power source outputs a high level, the coil is powered on to generate a magnetic field, and the magnetic switch outputs an on signal in response to sensing the magnetic field. Also, for example, when the first power source outputs a low level, the coil is powered off to eliminate the magnetic field, and the magnetic switch outputs an off signal in response to sensing the elimination of the magnetic field. By controlling the magnetic switch to be turned on using a high level or a low level outputted by the first power source, the control of the magnetic switch is more convenient.

Figure 2:
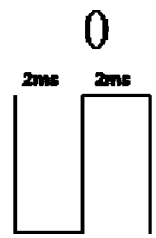
FIG. 2 is a schematic diagram of coded data of a system for controlling a magnetic switch.
Figure 3:
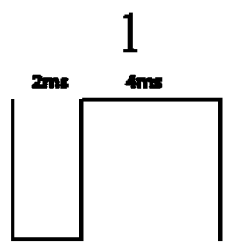
FIG. 3 is a schematic diagram of coded data of a system for controlling a magnetic switch.

In one or more embodiments, the system/method includes a sensing device that is electrically connected to the magnetic switch. The first power source outputs a high level or a low level to generate a pulse signal, the sensing device generates coded data according to the on signal or the off signal outputted by the magnetic switch, and the sensing device adjusts sensing parameters of the sensing device according to the coded data. The magnetic switch is used to control input signals at the input terminal of the sensing device, and the on or off of the magnetic switch could lead to different input signals at the input terminal of the sensing device. When the first power source outputs a high level or a low level to generate a pulse signal, the magnetic switch outputs an on signal or an off signal according to the received pulse signal, the sensing device places these on signals and off signals together to generate coded data, and adjusts sensing parameters of the sensing device according to the coded data. The coded data are expressed by pulse signals generated by on signals and off signals. As shown in FIG. 2, the data code 0 is expressed by a pulse signal formed by a 2 ms low level and a 2 ms high level. As shown in FIG. 3, the data code 1 is expressed by a pulse signal formed by a 2 ms low level and a 4 ms high level. Sensing parameters of the sensing device include, for example, a sensing length of a urinal motion sensor. If only an on signal or an off signal is used to adjust sensing parameters of a sensing device, it is impossible to specifically control types and accuracy of sensing parameters, while the adjustment of sensing parameters of a sensing device according to the coded data improves adjustable types and accuracy of sensing parameters.

In one or more embodiments, the switch control unit 10 includes a controller and a triode. The controller is electrically connected to a base of the triode, a collector of the triode is electrically connected to a second end of the coil, and an emitter of the triode is grounded. The controller can continuously transmit pulse signals, whereby the increase of the transmitting frequency increases the switching frequency of the magnetic switch, such that the transmitted pulse signals meet the requirement of the sensing device, and the accuracy of the transmitted pulse signals is improved. The triode can control the power-on and power-off of the coil. For example, an NPN triode may be used, such that the coil is powered off in response to a low level being inputted to the base of the triode, and the coil is powered on in response to a high level being inputted to the base of the triode.

In one or more embodiments, the system/method includes a sensing device electrically connected to a magnetic switch. The controller may transmit a pulse signal generated by a high level and a low level, and the sensing device may receive the pulse signal via a magnetic field and generate coded data according to the pulse signal. The sensing device may adjust sensing parameters of the sensing device according to the coded data. The controller may be a microprogrammed controller, through which pulse signals are transmitted and the accuracy of the transmitted pulse signals is improved. By transmitting pulse signals through the controller, the magnetic field of the current coil is controlled, such that the reed switch generates coded data. The control in such a manner is more accurate for a sensor equipped with a reed switch, and enables the reed switch to encode and communicate.

In one or more embodiments, the system/method includes a sensing device electrically connected to a magnetic switch. The controller may transmit a pulse signal generated by a high level and a low level, and the sensing device may generate coded data according to the on signal or the off signal outputted by the magnetic switch. The sensing device may combine a plurality of the coded data into command data and adjusts sensing parameters of the sensing device according to the command data. The sensing device and the controller may be configured to develop a protocol in advance, for example, to define 8-bit data as the length of command data, the command data are formed by the coded data, and different command data represent different commands. For example, 0b10110101 may represent that the sensing distance is adjusted to be 1 cm shorter, and 0b00001010 may represent that the sensing distance is adjusted to be 1 cm longer. By defining the command data, the adjustment range of sensing parameters is increased, and the adjustment accuracy is improved.

In one or more embodiments, different coded data correspond to different pulse waves. Different coded data can be expressed by different pulse waves, such that mistakes are avoided in the coded data and the accuracy is improved. As shown in FIG. 2, the data code 0 is expressed by a pulse signal formed by a 2 ms low level and a 2 ms high level. As shown in FIG. 3, the data code 1 is expressed by a pulse signal formed by a 2 ms low level and a 4 ms high level.

In one or more embodiments, the sensing device includes a urinal motion sensor, a faucet motion sensor, and a toilet sensor. With a urinal motion sensor as an example, the urinal motion sensor generates coded data according to the on signal or the off signal outputted by a magnetic switch, combines a plurality of the coded data into command data, and determines if the command data is the same as a predefined command threshold value. The system/method correspondingly carries out the adjustment of a sensing parameter corresponding to a command threshold value in response to a predefined command threshold value being satisfied. For example, the command data, 0b00001010, may cause the sensing distance of the urinal motion sensor to increase by 1 cm.

In one or more embodiments, the magnetic switch is a reed switch. The use of a reed switch as a switch has high accuracy and low cost.

Figure 4:
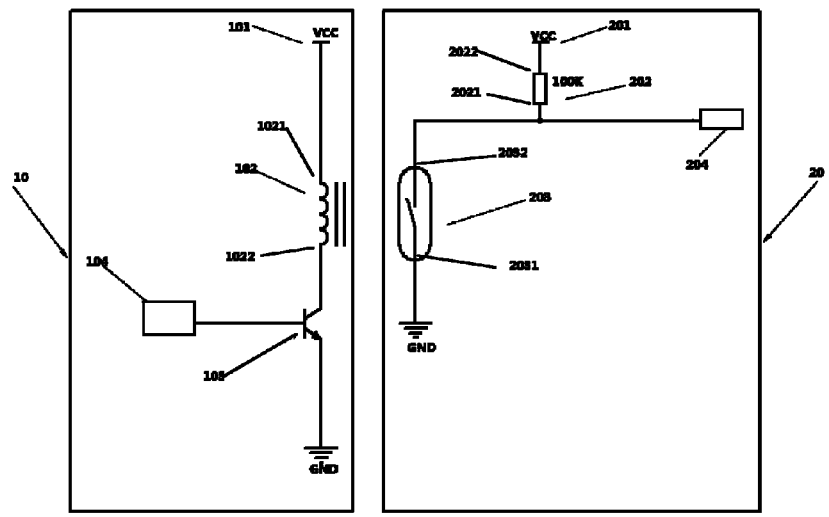
FIG. 4 illustrates an exemplary embodiment of a circuit of a system for controlling a magnetic switch.

FIG. 4 illustrates an exemplary embodiment of a circuit of a system for controlling a magnetic switch. The system includes a switch control unit 10 and a control signal receiving unit 20. As shown in FIG. 4, the circuit/switch control unit 10 includes a ground GND (note that GND is a legend/symbol for grounding), a first power source 101 (note that VCC is a legend/symbol for a power source), a coil 102, an NPN triode 103, and a controller 104; and the circuit/signal receiving unit 20 includes a second power source 201, a pull up resistor 202, a reed switch 203, a ground GND, and urinal motion sensor 204. In other words, the first power source 101, the coil 102, the NPN triode 103 and the controller 104 are used as the switch control unit 10, and the second power source 201, the pull-up resistor 202, the reed switch 203 and the urinal motion sensor 204 are used as the control signal receiving unit 20.

In the switch control unit 10, a first end 1021 of the coil 102 is connected to the first power source 101, a second end 1022 of the coil 102 is electrically connected to the collector of the triode 103, the controller 104 is electrically connected to the base of the triode 103, and the emitter of the triode 103 is grounded.

In the control signal receiving unit 20, a first end 2031 of the reed switch 203 is grounded, a second end 2032 of the reed switch 203 is electrically connected to a first end 2021 of the pull up resistor 202 and an input terminal of the urinal motion sensor 204, respectively, and a second end 2022 of the pull up resistor 202 is electrically connected to the second power source 201.

The controller 104 transmits a pulse signal formed by a high level and a low level. The system/method is configured such that when the base of the NPN triode 103 receives a low level, the coil is powered off and does not generate a magnetic field, the reed switch 203 does not sense a magnetic field and is in an off state, and at this point, a high level is inputted to the input terminal of the urinal motion sensor 204. The system/method is configured such that when the base of the NPN triode 103 receives a high level, the coil 102 is powered on and generates a magnetic field, the reed switch 203 senses a magnetic field and is in an on state, and at this point, a low level is inputted to the input terminal of the urinal motion sensor 204. If it is desired to increase the sensing distance of the urinal motion sensor 204 by a distance (e.g., 1 cm), the controller 104 transmits a pulse signal corresponding to the command data 0b00001010. The pulse signal transmitted by the controller 104 causes the reed switch 203 to output an on signal or an off signal, the urinal motion sensor 204 places these on signals and off signals together to generate coded data, combines a plurality of the coded data into command data, and compares the command data with the command threshold value predefined to increase the sensing distance of the urinal motion sensor by the distance (e.g., 1 cm). If they (e.g., the command data and the command threshold value) are the same, the command to increase the sensing distance of the urinal motion sensor 204 by the distance (e.g., 1 cm) is carried out.

Figure 5:
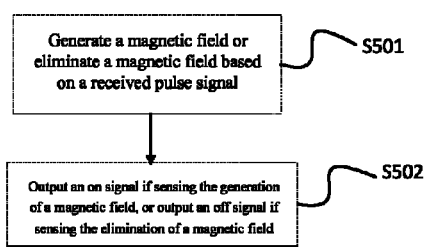
FIG. 5 is a flow chart of a method for controlling a magnetic switch according to an exemplary embodiment.

FIG. 5 illustrates an exemplary method for controlling a magnetic switch, such as, for example, by the circuit/system shown in FIG. 4. As shown in FIG. 5, the method includes a first step S501 and a second step S502. In the first step S501, a magnetic field is generated or eliminated in response to (e.g., based on) a received pulse signal. In the second step S502, an on signal is outputted in response to sensing the generation of a magnetic field, and an off signal is outputted in response to sensing the elimination of a magnetic field. Thus, the method first receives a pulse signal via the first step S501, such that a magnetic field is generated when the pulse signal is a high level, and the magnetic field is eliminated when the pulse signal is a low level; and then, the magnetic field is sensed in the second step S502, such that an on signal is outputted in response to a magnetic field being sensed and an off signal is outputted in response to the elimination of the magnetic field being sensed.

With the method according to the systems/methods disclosed in this application, the control of magnetic switches is no longer dependent on a magnetic rod, and the control of magnetic switches becomes more convenient and accurate.

The above embodiments only show several ways to implement the present invention, the description is relatively specific and detailed, which, however, cannot be construed to be a limitation to the scope of the present invention. It should be noted that, to those skilled in the art, a number of variations and improvements may be made without departing from the concept of the present invention, all of which shall be encompassed by the scope of the present invention. Therefore, the scope of the present invention shall be subjected to the appended claims.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

The terms "coupled," "connected," and the like, as used herein, mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

The construction and arrangement of the elements of the systems/circuits, as shown in the exemplary embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements, the position of elements may be reversed or otherwise varied, and the nature or number of discrete elements or positions may be altered or varied.

Additionally, the word "exemplary" is used to mean serving as an example, instance, or illustration. Any embodiment or design described herein as "exemplary" is not necessarily to be construed as preferred or advantageous over other embodiments or designs (and such term is not intended to connote that such embodiments are necessarily extraordinary or superlative examples). Rather, use of the word "exemplary" is intended to present concepts in a concrete manner. Accordingly, all such modifications are intended to be included within the scope of the present disclosure. Other substitutions, modifications, changes, and omissions may be made in the design, operating conditions, and arrangement of the preferred and other exemplary embodiments without departing from the scope of the appended claims.

Other substitutions, modifications, changes and omissions may also be made in the design, operating conditions and arrangement of the various exemplary embodiments without departing from the scope of the present invention. For example, any element (e.g., power supply, switch, sensor, etc.) disclosed in one embodiment may be incorporated or utilized with any other embodiment disclosed herein. Also, for example, the order or sequence of any process or method steps may be varied or re-sequenced according to alternative embodiments. Any means-plus-function clause is intended to cover the structures described herein as performing the recited function and not only structural equivalents but also equivalent structures. Other substitutions, modifications, changes and omissions may be made in the design, operating configuration, and arrangement of the preferred and other exemplary embodiments without departing from the scope of the appended claims.

What is claimed is:

1. A urinal or toilet, comprising:
   a switch control unit that generates and eliminates a magnetic field in response to a pulse signal, the switch unit comprising:
   a power source; and
   a coil having a first end electrically coupled to the power source to generate the magnetic field in an on position, in which the coil receives an electric current from the power source; and
   a control signal receiving unit comprising:
   a motion sensor having an input terminal; and
   a normally open reed switch that closes in response to the magnetic field to output an on signal to the input terminal.

2. The urinal or toilet of claim 1, wherein the switch control unit further comprises:
   a controller for outputting the pulse signal; and
   a triode having a base, a collector, and an emitter, wherein the base is electrically coupled to the controller, the collector is electrically coupled to a second end of the coil, and the emitter is grounded.

3. The urinal or toilet of claim 2, wherein the control signal receiving unit further comprises:
   a power source; and
   a resistor having a first end, which is electrically coupled to the reed switch, and a second end, which is electrically coupled to the power source.

4. The urinal or toilet of claim 3, wherein the normally open reed switch is open in an absence of the magnetic field and an off signal is output to the input terminal.

5. The urinal or toilet of claim 4, wherein the motion sensor generates coded data in response to the on signals, combines a plurality of the coded data into command data, and compares the command data with a command threshold value predefined to increase a sensing distance of the motion sensor by a distance.

6. The urinal or toilet of claim 4, wherein the power source of the switch control unit outputs a high level or a low level to generate the pulse signal.

7. The urinal or toilet of claim 6, wherein the motion sensor generates coded data according to the on signal or the off signal outputted by the reed switch.

8. The urinal or toilet of claim 7, wherein the motion sensor adjusts sensing parameters of the motion sensor in response to the coded data.

9. The urinal or toilet of claim 8, wherein different coded data correspond to different pulse waves.

10. A urinal or toilet, comprising:
    a switch control unit that generates and eliminates the magnetic field based on a received pulse signal; and
    a control signal receiving unit that is electrically connected to the switch control unit through a magnetic field;
    wherein the control signal receiving unit outputs an on signal in response to sensing the generation of the magnetic field and outputs an off signal in response to sensing the elimination of the magnetic field.

11. The urinal or toilet of claim 10, wherein the switch control unit comprises a first power source and a coil, a first end of the coil is connected to the first power source, and a second end of the coil is grounded; and wherein the control signal receiving unit comprises a magnetic switch that outputs the on signal in response to sensing the generation of the magnetic field and outputs the off signal in response to sensing the elimination of the magnetic field.

12. The urinal or toilet of claim 11, further comprising a sensing device electrically connected to the magnetic switch, wherein the first power source outputs a high level or a low level to generate the pulse signal, the sensing device generates coded data according to the on signal or the off signal outputted by the magnetic switch, and the sensing device adjusts sensing parameters of the sensing device in response to the coded data.

13. The urinal or toilet of claim 12, wherein different coded data correspond to different pulse waves.

14. The urinal or toilet of claim 11, wherein the switch control unit further comprises a controller and a triode, wherein the controller is electrically connected to a base of the triode, a collector of the triode is electrically connected to a second end of the coil, and an emitter of the triode is grounded.

15. The urinal or toilet of claim 14, further comprising a sensing device electrically connected to the magnetic switch, wherein the controller transmits the pulse signal generated by a high level and a low level, the sensing device generates coded data according to the on signal or the off signal outputted by the magnetic switch, and the sensing device combines a plurality of the coded data into command data and adjusts sensing parameters of the sensing device in response to the command data.

16. The urinal or toilet of claim 15, wherein different coded data correspond to different pulse waves.

17. The urinal or toilet of claim 16, wherein the sensing device comprises a motion sensor, and wherein the magnetic switch is a reed switch.

18. A urinal or toilet, comprising:
    a power source that generates a pulse signal;
    a coil electrically coupled to the power source to generate a magnetic field in an on position in response to the pulse signal;
    a motion sensor having an input terminal; and
    a normally open reed switch that closes in response to the magnetic field to output an on signal to the input terminal.

19. The urinal or toilet of claim 18, further comprising:
    a controller that outputs the pulse signal based on a high level or a low level output from the power source;
    a triode comprising a base, a collector, and an emitter, wherein the base is electrically coupled to the controller, the collector is electrically coupled to the coil, and the emitter is grounded; and
    a resistor having a first end, which is electrically coupled to the normally open reed switch, and a second end, which is electrically coupled to the power source.

20. The urinal or toilet of claim 19, wherein the normally open reed switch is open in an absence of the magnetic field and an off signal is output to the input terminal.

* * * * *